United States Patent
Kim et al.

(10) Patent No.: US 9,728,740 B2
(45) Date of Patent: Aug. 8, 2017

(54) ORGANIC LIGHT-EMITTING DISPLAY APPARATUS AND METHOD OF MANUFACTURING THE SAME

(71) Applicants: Samsung Display Co., Ltd., Yongin, Gyeonggi-Do (KR); IUCF-HYU(Industry-University Cooperation Foundation Hanyang University), Seoul (KR)

(72) Inventors: Seunghun Kim, Yongin (KR); Myungmo Sung, Seoul (KR); Seungyong Song, Yongin (KR); Cheol Jang, Yongin (KR)

(73) Assignees: Samsung Display Co., Ltd., Yongin, Gyeonggi-Do (KR); Industry-University Cooperation Foundation Hanyang University (IUCF-HYU), Seoul (KR)

( * ) Notice: Subject to any disclaimer, the term of this patent is extended or adjusted under 35 U.S.C. 154(b) by 0 days.

(21) Appl. No.: 14/724,500

(22) Filed: May 28, 2015

(65) Prior Publication Data
US 2016/0164026 A1 Jun. 9, 2016

(30) Foreign Application Priority Data
Dec. 5, 2014 (KR) .................. 10-2014-0174263

(51) Int. Cl.
*H01L 51/52* (2006.01)
*H01L 51/56* (2006.01)

(52) U.S. Cl.
CPC .......... *H01L 51/5246* (2013.01); *H01L 51/56* (2013.01); *H01L 2251/303* (2013.01)

(58) Field of Classification Search
CPC combination set(s) only.
See application file for complete search history.

(56) References Cited

U.S. PATENT DOCUMENTS

2006/0066234 A1 3/2006 Lu et al.
2008/0305360 A1* 12/2008 Han .................. H01L 51/5256
428/690

(Continued)

FOREIGN PATENT DOCUMENTS

KR 10-2008-0107220 A 12/2008
KR 10-0899447 B1 5/2009

(Continued)

*Primary Examiner* — Kyoung Lee
*Assistant Examiner* — Ratisha Mehta
(74) *Attorney, Agent, or Firm* — Knobbe Martens Olson & Bear LLP (57) ABSTRACT

Provided are an organic light-emitting display apparatus and a method of manufacturing the same. The organic light-emitting display apparatus includes a first substrate; an organic light-emitting device provided on the first substrate and including a first electrode, a second electrode, and an intermediate layer positioned between the first electrode and the second electrode; a second substrate covering the organic light-emitting device and disposed to face the first substrate; and a sealant bonding the first substrate and the second substrate, wherein at least a portion of the sealant is a intermixing region which is formed as an inorganic material permeates an organic material.

11 Claims, 3 Drawing Sheets

(56) References Cited

U.S. PATENT DOCUMENTS

| | | | |
|---|---|---|---|
| 2009/0167132 A1* | 7/2009 | Bae | H01L 51/5246 |
| | | | 313/1 |
| 2010/0096984 A1* | 4/2010 | Kim | H01L 51/5262 |
| | | | 313/512 |
| 2010/0155247 A1 | 6/2010 | Cao et al. | |
| 2011/0133170 A1 | 6/2011 | Oh et al. | |
| 2012/0032355 A1 | 2/2012 | Wang et al. | |
| 2012/0080671 A1 | 4/2012 | Niboshi et al. | |

FOREIGN PATENT DOCUMENTS

| | | |
|---|---|---|
| KR | 10-2011-0062992 A | 6/2011 |
| KR | 10-2012-0024658 A | 3/2012 |

* cited by examiner

ORGANIC LIGHT-EMITTING DISPLAY APPARATUS AND METHOD OF MANUFACTURING THE SAME

RELATED APPLICATION

Any and all applications for which a foreign or domestic priority claim is identified in the Application Data Sheet as filed with the present application are hereby incorporated by reference under 37 CFR 1.57. This application claims the benefit of Korean Patent Application No. 10-2014-0174263, filed on Dec. 5, 2014, in the Korean Intellectual Property Office, the disclosure of which is incorporated herein in its entirety by reference.

BACKGROUND

Field

The disclosure relates to an apparatus and a method, and more particularly, to an organic light-emitting display apparatus and a method of manufacturing the same.

Description of the Related Technology

Generally, an organic light-emitting display apparatus has excellent features as an active light-emitting type display device. For example, the organic light-emitting display apparatus not only has a wide viewing angle and a high contrast ratio but also may be driven at a low voltage. Furthermore, the organic light-emitting display apparatus is thin and lightweight and has a fast response time. Accordingly, the organic light-emitting display apparatus is being noted as a next-generation display device.

Such a light-emitting device is divided into an inorganic light-emitting device and an organic light-emitting device according to a material of an emission layer of the light-emitting device. The organic light-emitting device has better features in terms of luminance, response time, and the like than the inorganic light-emitting device and enables color display. Thus, development of the organic light-emitting device is in active progress recently.

The organic light-emitting device may be degraded due to permeation of external oxygen and moisture. Accordingly, the organic light-emitting device should be protected from the permeation of external oxygen and moisture in order to improve reliability. To solve the problem, research on a method of sealing the organic light-emitting device by using an inorganic material sealant such as a frit is in progress. However, such a frit encapsulation structure damages the organic light-emitting device because a high-temperature bonding process is required to cure the frit, is unfavorable for a substrate having a large area because it takes considerable time to irradiate laser, and degrades the device integrity.

SUMMARY

One or more exemplary embodiments include an organic light-emitting display apparatus and a method of manufacturing the same.

Additional aspects will be set forth in part in the description which follows and, in part, will be apparent from the description, or may be learned by practice of the presented embodiments.

According to some embodiments, an organic light-emitting display apparatus includes a first substrate; an organic light-emitting device provided on the first substrate and including a first electrode, a second electrode, and an intermediate layer positioned between the first electrode and the second electrode; a second substrate covering the organic light-emitting device and disposed to face the first substrate; and a sealant bonding the first substrate and the second substrate, wherein at least a portion of the sealant is a intermixing region which is formed as an inorganic material permeates an organic material.

The sealant may have the intermixing region formed by filling free volume of the organic material with the inorganic material.

The organic material may be formed of one or more materials selected from the group consisting of an acrylate-based resin, a methacrylate-based resin, polyisoprene, a vinyl-based resin, an epoxy-based resin, a urethane-based resin, a cellulose-based resin, and a parylene-based resin.

The inorganic material may be formed of one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The intermixing region may be formed as the inorganic material permeates the organic material through sequential vapor infiltration (SVI).

A thickness of the intermixing region may be less than a thickness of an organic film formed by the organic material.

The intermixing region may be formed on the outside of the sealant.

A volume of the inorganic material per unit volume of the sealant may decrease in a direction from an outermost perimeter of the organic light-emitting display apparatus to the inside of the organic light-emitting display apparatus.

According to some embodiments, an organic light-emitting display apparatus includes a first substrate; an organic light-emitting device provided on the first substrate and including a first electrode, a second electrode, and an intermediate layer positioned between the first electrode and the second electrode; a second substrate covering the organic light-emitting device and disposed to face the first substrate; and a first sealant and a second sealant bonding the first substrate and the second substrate and disposed to face each other, wherein at least one of the first sealant and the second sealant includes a intermixing region formed as an organic material is partially permeated by an inorganic material.

The first sealant may have a first intermixing region formed by filling free volume of a first organic material with a first inorganic material, and the second sealant may have a second intermixing region formed by filling free volume of a second organic material with a second inorganic material.

At least one of the first intermixing region and the second intermixing region may be formed by using sequential vapor infiltration (SVI).

Each of the first organic material and the second organic material may be formed of one or more materials selected from the group consisting of an acrylate-based resin, a methacrylate-based resin, polyisoprene, a vinyl-based resin, an epoxy-based resin, a urethane-based resin, a cellulose-based resin, and a parylene-based resin.

Each of the first inorganic material and the second inorganic material may be formed of one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first intermixing region and the second intermixing region may face the outside of the organic light-emitting display apparatus.

The first intermixing region may be formed toward the organic light-emitting device, and the second intermixing region may be formed toward a perimeter of the organic light-emitting display apparatus.

According to some embodiments, a method of manufacturing an organic light-emitting display apparatus includes preparing a first substrate on which an organic light-emitting device is formed; and covering the organic light-emitting device by bonding the first substrate and a second substrate with a sealant, wherein the sealant is formed by using sequential vapor infiltration (SVI) such that an inorganic material permeates an organic material.

The sealant may be disposed in a chamber, and the inorganic material may be injected as a gas into the chamber and may spread through free volume of the organic material.

The inorganic material may have a source gas spreading through the free volume of the organic material and a reactive gas spreading through the free volume of the organic material thereafter and reacting with the source gas.

BRIEF DESCRIPTION OF THE DRAWINGS

These and/or other aspects will become apparent and more readily understood from the following description of the exemplary embodiments, taken in conjunction with the accompanying drawings in which.

DETAILED DESCRIPTION

As the disclosure allows for various changes and numerous embodiments, exemplary embodiments will be illustrated in the drawings and described in detail in the written description. The effect and feature of the disclosure and methods of accomplishing the same will become apparent from the following description of the exemplary embodiments in detail, taken in conjunction with the accompanying drawings. The disclosure may, however, be embodied in many different forms and should not be construed as limited to the exemplary embodiments set forth herein.

While such terms as "first" and "second" may be used to describe various components, such components must not be limited to the above terms. The above terms are used only to distinguish one component from another. Also, the singular forms "a," "an," and "the" are intended to include the plural forms as well, unless the context clearly indicates otherwise. It will be understood that the terms such as "include," "comprise," and "have" used herein specify the presence of stated features or components, but do not preclude the presence or addition of one or more other features or components.

Sizes of components in the drawings may be exaggerated for convenience of explanation. In other words, since sizes and thicknesses of components in the drawings are arbitrarily illustrated for convenience of explanation, the following exemplary embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a specific process order may be performed differently from the described order. For example, two consecutively described processes may be performed substantially at the same time or performed in an order opposite to the described order.

Reference will now be made in detail to exemplary embodiments, examples of which are illustrated in the accompanying drawings. Like reference numerals in the drawings denote like elements, and thus repeated descriptions thereof will be omitted. As used herein, the term "and/or" includes any and all combinations of one or more of the associated listed items. Expressions such as "at least one of," when preceding a list of elements, modify the entire list of elements and do not modify the individual elements of the list.

Figure 1:
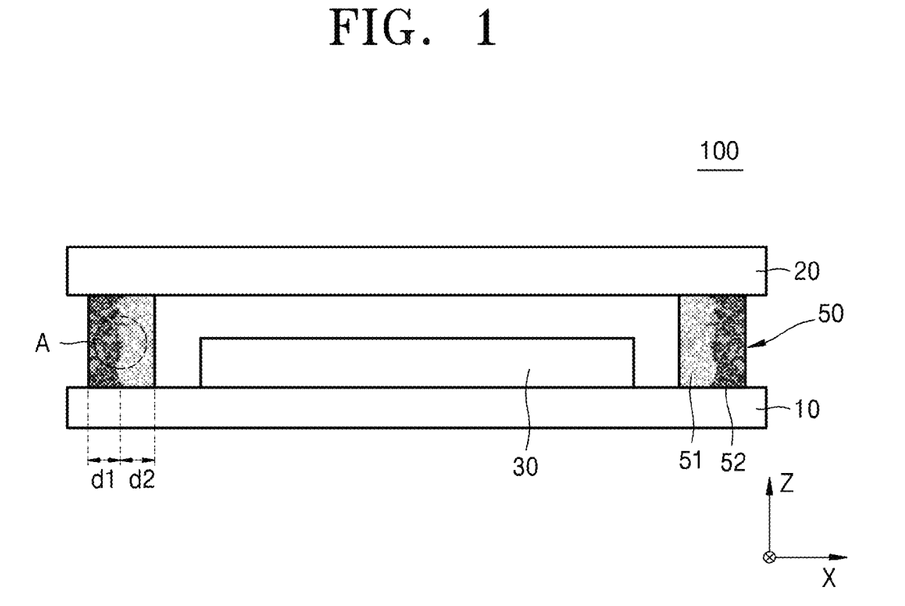
FIG. 1 is a front view of an organic light-emitting display apparatus according to an embodiment.
Figure 2:
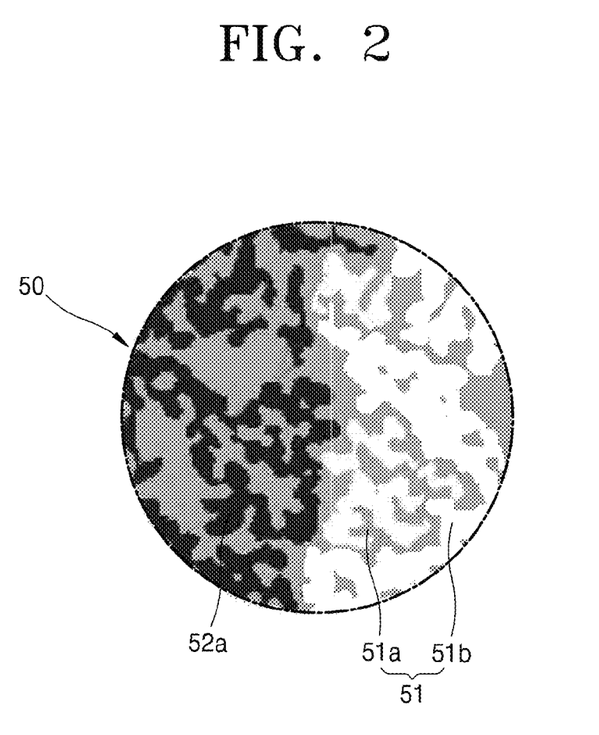
FIG. 2 is a cross-sectional view in which an area A of FIG. 1 is enlarged.
Figure 3:
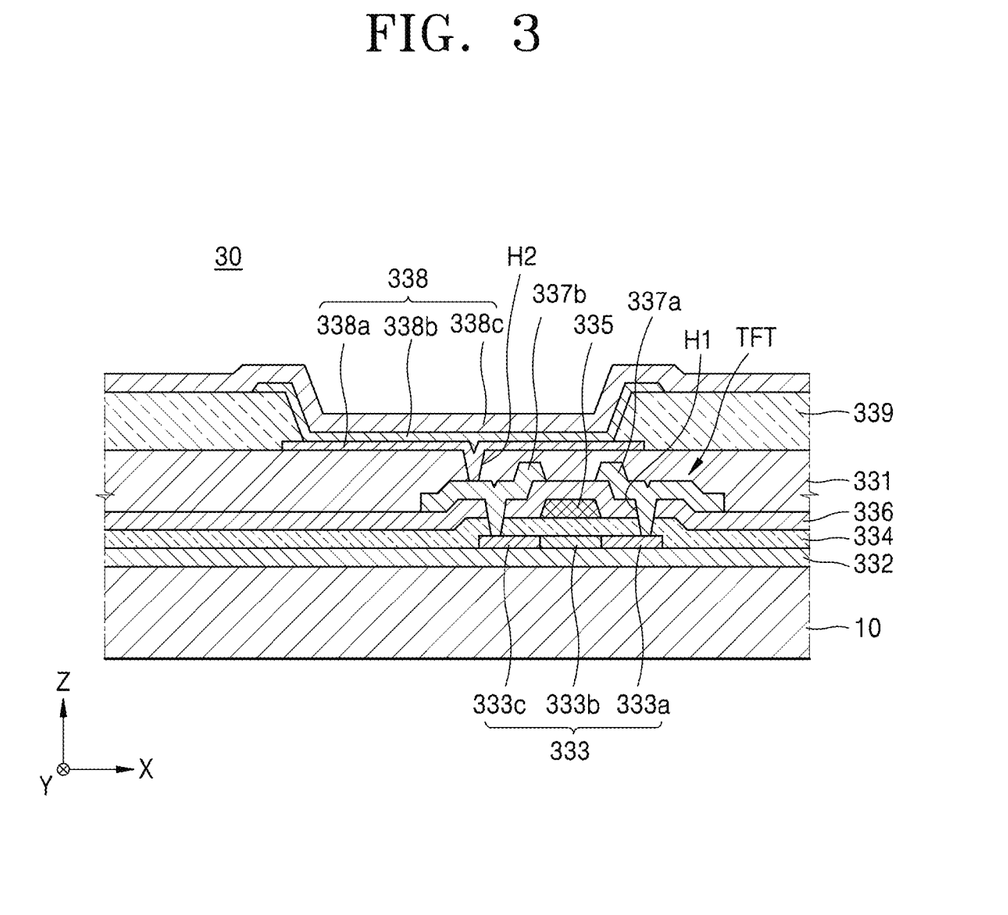
FIG. 3 is a cross-sectional view of an organic light-emitting device of FIG. 1.

FIG. 1 is a front view of an organic light-emitting display apparatus 100 according to an embodiment. FIG. 2 is a cross-sectional view in which an area A of FIG. 1 is enlarged. FIG. 3 is a cross-sectional view of an organic light-emitting device 30 of FIG. 1.

Referring to FIGS. 1 to 3, the organic light-emitting display apparatus 100 may include a first substrate 10, a second substrate 20, the organic light-emitting device 30, and a sealant 50.

The first substrate 10 may be formed of transparent glass mainly including $SiO_2$. The first substrate 10 is not limited thereto and may also be formed of a transparent plastic material. The plastic material that is used to form the first substrate 10 may be an insulating organic material and may be an organic material selected from the group consisting of polyethersulfone (PES), polyacrylate, polyetherimide (PEI), polyethylene naphthalate (PEN), polyethylene terephthalate (PET), polyphenylene sulfide (PPS), polyarylate (PAR), polyimide, polycarbonate (PC), cellulose triacetate (TAC), and cellulose acetate propionate (CAP).

In the case of a bottom-emission type apparatus where an image is embodied in a direction of the first substrate 10, the first substrate 10 should be formed of a transparent material. However, in the case of a top-emission type apparatus where an image is embodied in an opposite direction of the first substrate 10, the first substrate 10 does not necessarily need to be formed of a transparent material. In this case, a metal may be used to form the first substrate 10. In the case that the metal is used to form the first substrate 10, the first substrate 10 may include one or more selected from the group consisting of carbon (C), iron (Fe), chromium (Cr), manganese (Mn), nickel (Ni), titanium (Ti), molybdenum (Mo), stainless steel (SUS), an INVAR alloy, an INCONEL alloy, and a KOVAR alloy; however, the first substrate 10 is not limited thereto. The first substrate 10 may be formed of a metal foil.

The first substrate 10 on which the organic light-emitting device 30 is provided is bonded to the second substrate 20 disposed above the organic light-emitting device 30. Not only a glass substrate but also a plastic substrate such as an acrylic-substrate may be used for the second substrate 20. Furthermore, a metal plate may also be used for the second substrate 20.

The organic light-emitting device 30 may have a light-emitting unit formed on the first substrate 10. The light-emitting unit may include a thin film transistor (TFT). Also, a passivation film 331 may be formed to cover the light-emitting unit and the TFT, and an organic light-emitting device (OLED) 338 may be formed on the passivation film 331.

A buffer layer 332 that is formed of an organic compound and/or an inorganic compound is further formed on a top surface of the first substrate 10 and may be formed of $SiO_x$ ($x≥1$) or $SiN_x$ ($x≥1$). After an active layer 333 arranged in a predetermined pattern is formed on the buffer layer 332, the active layer 333 is covered by a gate insulating layer 334. The active layer 333 includes a source region 333a and a drain region 333c and further includes a channel region 333b between the source region 333a and the drain region 333c.

The active layer 333 may contain various materials. For example, the active layer 333 may contain an inorganic semiconductor material such as amorphous silicon or crystalline silicon. In another example, the active layer 333 may contain an oxide semiconductor. Alternatively, the active layer 333 may contain an organic semiconductor material. Hereinafter, a case in which the active layer 333 is formed of amorphous silicon will be mainly described in detail for convenience of description.

The active layer 333 may be formed by forming an amorphous silicon film on the buffer layer 332, crystallizing the amorphous silicon film into a polycrystalline silicon film, and patterning the polycrystalline silicon film. The active layer 333 has the source region 333a and the drain region 333c doped with impurities based on a type of the TFT, such as a driving TFT (not shown) or a switching TFT (not shown).

A gate electrode 335 corresponding to the active layer 333 and an interlayer insulating layer 336 covering the gate electrode 335 are formed on a top surface of the gate insulating layer 334.

After contact holes are formed in the interlayer insulating layer 336 and the gate insulating layer 334, a source electrode 337a and a drain electrode 337b are formed on the interlayer insulating layer 336 so as to respectively contact the source region 333a and the drain region 333c.

On an upper portion of the TFT formed as such, the passivation film 331 is formed. On an upper portion of the passivation film 331, a pixel electrode 338a of the OLED 338 is formed. The pixel electrode 338a contacts the drain electrode 337b of the TFT via a via hole H2 formed in the passivation film 331. The passivation film 331 may be formed of an inorganic material and/or an organic material as a single layer or two or more layers. The passivation film 331 may be formed as a planarization film so as to planarize a top surface of the passivation film 331 regardless of an uneven portion of a film that is disposed under the passivation film 331. On the contrary, the passivation film 331 may be formed such that the top surface of the passivation film 331 is uneven due to the uneven portion of the film that is disposed under the passivation film 331. Also, the passivation film 331 may be formed of a transparent insulator to accomplish a resonance effect.

After the pixel electrode 338a is formed on the passivation film 331, a pixel defining film 339 is formed of an organic material and/or an inorganic material to cover the pixel electrode 338a and the passivation film 331, and an opening is formed in the pixel defining film 339 to expose the pixel electrode 338a.

Also, an intermediate layer 338b and an opposite electrode 338c are formed at least on the pixel electrode 338a.

Although the pixel electrode 338a serves as an anode and the opposite electrode 338c serves as a cathode, polarities of the pixel electrode 338a and the opposite electrode 338c may be reversed. A first electrode may be any one of the pixel electrode 338a and the opposite electrode 338c, and a second electrode may be the other of the pixel electrode 338a and the opposite electrode 338c.

The pixel electrode 338a and the opposite electrode 338c are insulated from each another by the intermediate layer 338b, and apply voltages having polarities different from each other to the intermediate layer 338b so that light is emitted by an organic emission layer.

The intermediate layer 338b may include the organic emission layer. Alternatively, in addition to the organic emission layer, the intermediate layer 338b may further include at least one of a hole injection layer, a hole transport layer, an electron transport layer, and an electron injection layer. The present embodiment is not limited thereto, and the intermediate layer 338b may include the organic emission layer and may further include other various functional layers.

Meanwhile, a unit pixel includes a plurality of sub-pixels that may emit lights of various colors. For example, the sub-pixels may include sub-pixels that emit lights of red, green, and blue or sub-pixels that emit lights of red, green, blue, and white.

The sub-pixels may include the intermediate layers 338b having organic emission layers that emit lights of various colors. For example, the sub-pixels include the intermediate layers 338b having organic emission layers that emit lights of red, green, and blue.

In another example, the sub-pixels that emit lights of various colors may include the intermediate layers 338b having organic emission layers that emit lights of the same color, for example, white, and may include a color converting layer that converts the white light into a light of a predetermined color or a color filter.

The intermediate layer 338b emitting the white light may have a variety of structures. For example, the intermediate layer 338b may include a structure in which at least a light-emitting substance emitting a red light, a light-emitting substance emitting a green light, and a light-emitting substance emitting a blue light are stacked on one another.

In another example of a structure for emitting the white light, the intermediate layer 338b may include a structure in which at least a light-emitting substance emitting a red light, a light-emitting substance emitting a green light, and a light-emitting substance emitting a blue light are mixed.

The red, green, and blue colors are exemplary, and the present embodiment is not limited thereto. That is, any combination of other various colors, which is capable of emitting a white light, may be employed in addition to a combination of red, green, and blue colors.

The sealant 50 may bond the first substrate 10 and the second substrate 20 (FIG. 1). The sealant 50 may be formed such that at least a portion thereof is formed of an organic material 51a and the other portion is formed of the organic material 51a and an inorganic material 52a. The sealant 50 may have a intermixing region 52 formed by filling free volume 51b of the organic material 51a with the inorganic material 52a. That is, the intermixing region 52 may be formed by using sequential vapor infiltration (SVI) which will be described below.

The organic material 51a may be formed of one or more materials selected from the group consisting of an acrylate-based resin, a methacrylate-based resin, polyisoprene, a vinyl-based resin, an epoxy-based resin, a urethane-based resin, a cellulose-based resin, and a parylene-based resin.

The inorganic material 52a may be formed of one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The inorganic material 52a may be formed as a source gas and a reactive gas react with each other. After the source gas is injected into the free volume, a purge process is performed. The reactive gas is injected after the source gas permeates the free volume enough to form a intermixing region therein. The reactive gas reacts with the source gas injected into the free volume to form an inorganic material. Thus, the reactive gas may react with the source gas to form the inorganic material 52a in the free volume.

The source gas may be applied to the SVI. Also, the source gas is a gas that reacts with the reactive gas to form the inorganic material and is not limited to a specific substance. For example, tetrakis(dimethylamino)silane (TDMAS), tetrakis(ethylmethylamino)silane (TEMASi), tris (ethylmethylamino)silane (Tris-EMAS), tris(dimethylamino)silane (Tris-DMAS), tetraethylorthosilicate (TEOS), bis (ethylmethylamino)silane (BEMAS), bis(diethylamino) silane (BDEAS), trimethylaluminum (TMA), tritertiarybutyl aluminum (TTBA), tetrakis(ethylmethylamino)zirconium (TEMAZr), titanium tetrachloride ($TiCl_4$), tetrakis(dimethylamido)titanium (TDMAT), tetrakis(ethylmethylamino)titanium (TEMAT), tetrakis(diethylamino) titanium (TDEAT), titanium tetraisopropoxide (TTIP), tert-butylimino-tri(diethylamino)tantalum (TBTDET), tetrakis (ethylmethylamino)hafnium (TEMAHf), (tertiary-butylimido-tris-ethylmethylamido)tantalum (TBITEMATa), tert-butylimino-tri(diethylamino)tantalum (TBTDET), pentaetoxytantalum (PET), bis(tetramethylheptadinato)strontium ($Sr(tmhd)_2$), tetrakis(ethylmethylamino)antimony (TEMASb) or the like may be used as the source gas.

The reactive gas is a gas that reacts with the source gas to form the inorganic material and is not limited to a specific substance. For example, $H_2O$, $O_3$, $NH_3$, or the like may be used as the reactive gas.

Although the sealant 50 is disposed on the first substrate 10 and the second substrate 20 in FIG. 1, a position of the sealant 50 is not limited thereto, and the sealant 50 may be formed on the passivation film 331 or the pixel defining film 339 (FIG. 3). However, hereinafter, a case in which the sealant 50 is disposed on the first substrate 10 will be mainly described in detail for convenience of description.

The intermixing region 52 may block moisture or oxygen passing through the organic material 51a and permeating the organic light-emitting device 30. External moisture or oxygen may pass through free volume of an organic film. The intermixing region 52 is composed of the organic material 51a and the inorganic material 52a filling the free volume of the organic material 51a, and the inorganic material 52a may block permeation of moisture or oxygen by blocking free volume of an organic film 51.

A thickness d1 of the intermixing region 52 may be less than a thickness d2 of the organic film 51 formed by the organic material 51a. Since the intermixing region 52 is formed as the source gas and the reactive gas forming the inorganic material 52a spread through the free volume of the organic material 51a, the thickness d1 of the intermixing region 52 may be less than the thickness d2 of the organic film 51.

The intermixing region 52 may be formed on the outside of the sealant 50. As the intermixing region 52 is formed to contact an outer portion of the sealant 50, the intermixing region 52 may prevent moisture or oxygen from passing through the sealant 50 and permeating the organic light-emitting device 30.

A proportion of the inorganic material 52a in the sealant 50 may decrease in a direction from the outermost perimeter of the sealant 50 to the inside of the sealant 50. A volume of the inorganic material 52a per unit volume of the sealant 50 may decrease in a direction from the outermost perimeter of the organic light-emitting display apparatus 100 to the inside of the organic light-emitting display apparatus 100. The inorganic material 52a spreads from the outside of the organic light-emitting display apparatus 100 to the inside of the organic light-emitting display apparatus 100. At the outermost perimeter of the sealant 50, a source gas or a reactive gas for forming the inorganic material 52a may react easily and produce a large amount of a source gas inorganic material or a reactive gas inorganic material 52a. As a spreading speed of the source gas and/or the reactive gas decreases toward the inside of the sealant 50, an amount of the inorganic material 52a filling the free volume of the organic material 51a decreases.

A frit, which is an inorganic material, may be used in an encapsulation process. Although the frit has similar properties to glass and therefore has excellent moisture permeability, high-temperature laser should be irradiated for sealing. High-temperature heat may cause deformation of a substrate or an organic light-emitting device, which may change the stress of a material. Accordingly, the frit is required to be spaced apart from an organic light-emitting material, which degrades the quality of a display product due to increase of the dead space.

A hybrid form in which an organic material and an inorganic material are combined may be used in the encapsulation process. A sealant of the hybrid form may not effectively prevent permeation of moisture or oxygen because the sealant of the hybrid form includes separate films formed of the inorganic material and the organic material and the film formed of the inorganic material is cracked or damaged due to external shocks.

Since the inorganic material 52a permeates the free volume of the organic material 51a after the sealant 50 is formed of the organic material 51a, the organic light-emitting display apparatus 100 may be effectively protected from permeation of moisture or oxygen.

As the sealant 50 is formed by filling the free volume of the organic material 51a with the inorganic material 52a, the inorganic material 52a is not broken. Thus, durability of the organic light-emitting display apparatus 100 is improved.

As a proportion of the organic material 51a in the sealant 50 is high, the first substrate 10 and the second substrate 20 may be encapsulated by applying low-temperature heat thereto. That is, the sealant 50 may be disposed in the organic light-emitting display apparatus 100 to reduce the dead space.

Figure 4:
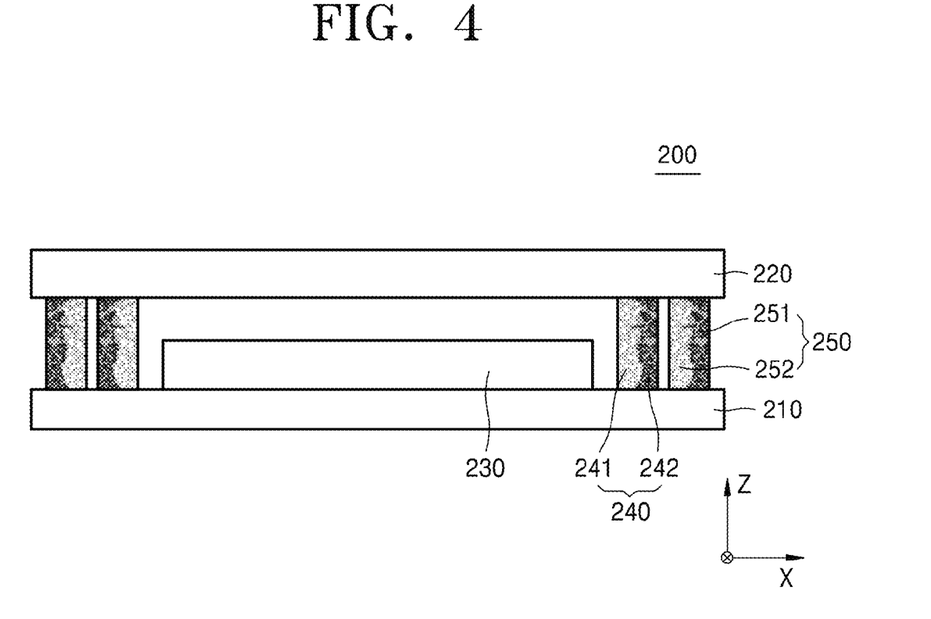
FIG. 4 is a front view of an organic light-emitting display apparatus according to another embodiment.

FIG. 4 is a front view of an organic light-emitting display apparatus 200 according to another embodiment.

Referring to FIG. 4, the organic light-emitting display apparatus 200 may include a first substrate 210, a second substrate 220, an organic light-emitting device 230, a first sealant 240, and a second sealant 250. Since the first substrate 210, the second substrate 220, and the organic light-emitting device 230 are the same or substantially similar to the first substrate 10, the second substrate 20, and the organic light-emitting device 30 respectively of the above-described organic light-emitting display apparatus 100, a repeated description thereof is omitted for simplification.

At least one of the first sealant 240 and the second sealant 250 may include a first intermixing region 242 and/or a second intermixing region 252 formed such that an organic material is partially permeated by an inorganic material. The first sealant 240 may have the first intermixing region 242 formed by filling free volume of a first organic material with a first inorganic material. The second sealant 250 may have the second intermixing region 252 formed by filling free volume of a second organic material with a second inorganic material. That is, at least one of the first intermixing region 242 and the second intermixing region 252 may be formed by using SVI.

Each of the first organic material and the second organic material may be formed of one or more materials selected from the group consisting of an acrylate-based resin, a methacrylate-based resin, polyisoprene, a vinyl-based resin, an epoxy-based resin, a urethane-based resin, a cellulose-based resin, and a parylene-based resin.

Each of the first inorganic material and the second inorganic material may be formed of one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and SiON.

The first intermixing region 242 and the second intermixing region 252 may face the outside of the organic light-emitting display apparatus 200. The organic light-emitting display apparatus 200 may include a plurality of intermixing regions, thereby effectively blocking permeation of moisture or oxygen.

The first sealant 240 may seal the first substrate 210 and the second substrate 220, and the first inorganic material may permeate the first sealant 240 in a direction from the outside of the organic light-emitting display apparatus 200 to the inside of the organic light-emitting display apparatus 200. That is, a source gas is injected in a direction from the outside of the first sealant 240 to the inside of the first sealant 240 and a reactive gas is injected thereafter to form the first inorganic material. Accordingly, the first intermixing region 242 may be formed on the outside of the first sealant 240.

Next, the second sealant 250 may be disposed along the first sealant 240 at the outside of the first sealant 240 to seal the first substrate 210 and the second substrate 220. The second inorganic material may permeate the second sealant 250 in a direction from the outside of the organic light-emitting display apparatus 200 to the inside of the organic light-emitting display apparatus 200. That is, a source gas is injected in a direction from the outside of the second sealant 250 to the inside of the second sealant 250 and a reactive gas is injected thereafter to form the second inorganic material. Accordingly, the second intermixing region 252 may be formed on the outside of the second sealant 250.

The second intermixing region 252 may block permeation of external moisture or oxygen in the front line. Also, the first intermixing region 242 may prevent moisture or oxygen which has passed through the second sealant 250 from permeating the organic light-emitting device 230.

The first intermixing region 242 may be formed toward the organic light-emitting device 230, and the second intermixing region 252 may be formed toward a perimeter of the organic light-emitting display apparatus 200. The second intermixing region 252 may be formed in contact with the outside so as to block permeation of external moisture or oxygen in the front line. The first intermixing region 242 may prevent moisture or oxygen which has passed through the second sealant 250 from permeating the organic light-emitting device 230. Also, the first intermixing region 242 may trap the moisture or oxygen which has passed through the second sealant 250. As moisture or oxygen which has permeated through the second intermixing region 252 is trapped in a space between the first intermixing region 242 and the second intermixing region 252, in free volume of a first organic film 241, or in free volume of a second organic film 251, the moisture or oxygen may be prevented from permeating the organic light-emitting device 230.

Figure 5:
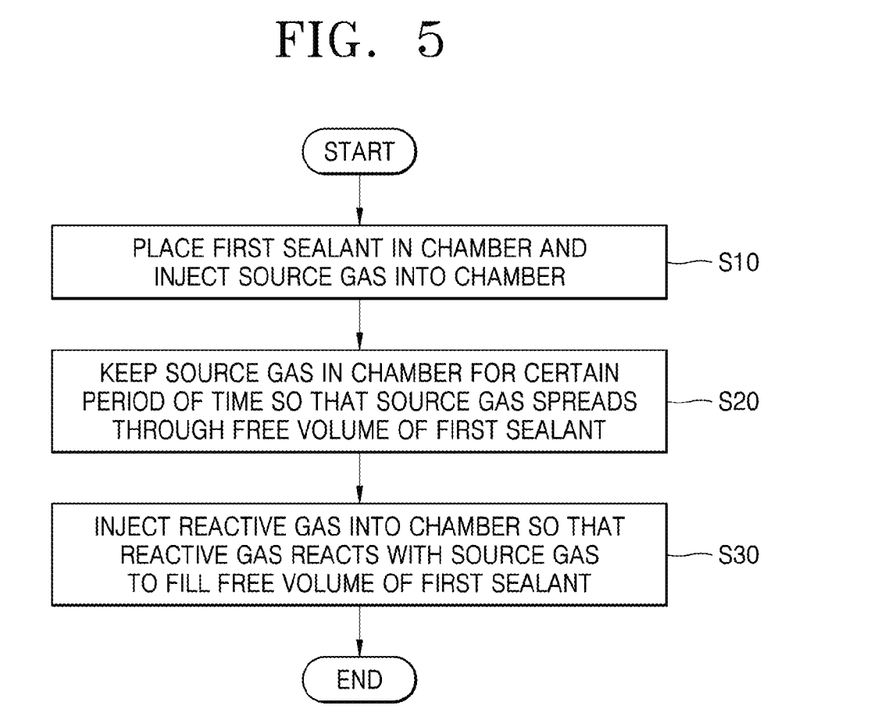
FIG. 5 is a block diagram for describing a method of manufacturing a sealant of FIG. 1.

FIG. 5 is a block diagram for describing a method of manufacturing the sealant 50 of FIG. 1. Referring to FIG. 5, a method of manufacturing the organic light-emitting display apparatus 100 may be understood as follows.

The first substrate 10 on which the organic light-emitting device 30 is formed is prepared, and the second substrate 20 is aligned with the first substrate 10 to bond the first substrate 10 and the second substrate 20. The first substrate 10 and the second substrate 20 may be bonded by applying heat to the sealant 50 to encapsulate the organic light-emitting display apparatus 100.

As a proportion of the organic material 51a in the sealant 50 is high, the first substrate 10 and the second substrate 20 may be bonded at relatively low temperatures. Thus, deformation of the organic light-emitting device 30, the first substrate 10, or the second substrate 20 due to heat may be reduced, and effectively an inactive space may be reduced.

The sealant 50 may be manufactured by using SVI. The sealant 50 may be manufactured as a sealant formed of the organic material 51a is disposed in a chamber (not shown) and the inorganic material 52a in a gaseous state is injected into the chamber and spreads through free volume of the organic material 51.

Therefore, the sealant 50 formed of an organic material is disposed in the chamber. In operation S10, a source gas which may react with a reactive gas to form the inorganic material 52a is injected into the chamber.

After a predetermined period of time, the source gas permeates free volume of an organic material. Thus, in operation S20, if the source gas is kept in the chamber for a certain period of time, the source gas spreads through the free volume of the organic material.

A reactive gas is injected and reacts with the source gas to form the inorganic material 52a. The source gas is purged, the reactive gas is injected into the chamber, and the reactive gas is kept in the chamber. In operation S30, the reactive gas permeates the free volume of the organic material due to diffusion, and the reactive gas may react with the source gas to form an inorganic material.

As described above, according to some embodiments, an organic light-emitting display apparatus and a method of manufacturing the same may reduce permeation of moisture or oxygen through an organic light-emitting device, thereby improving durability.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present disclosure as defined by the following claims.

What is claimed is:

1. An organic light-emitting display apparatus comprising:
   a first substrate;
   an organic light-emitting device provided on the first substrate and comprising a first electrode, a second electrode, and an intermediate layer positioned between the first electrode and the second electrode;
   a second substrate covering the organic light-emitting device and disposed to face the first substrate; and
   a sealant bonding the first substrate and the second substrate and comprising a first portion including organic material and a second portion including an inorganic material,
   wherein both of the first portion and the second portion are connected to the first substrate and the second substrate,
   wherein at least a portion of the sealant comprises an intermixing region in which the inorganic material permeates the organic material, and
   wherein a proportion of the inorganic material in the intermixing region decreases in a direction from the second portion to the first portion.

2. The apparatus of claim 1, wherein the organic material includes one or more materials selected from the group consisting of an acrylate-based resin, a methacrylate-based resin, polyisoprene, a vinyl-based resin, an epoxy-based resin, a urethane-based resin, a cellulose-based resin, and a parylene-based resin.

3. The apparatus of claim 1, wherein the inorganic material includes one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

4. The apparatus of claim 1, wherein the intermixing region is formed as the inorganic material permeates the organic material through sequential vapor infiltration (SVI).

5. The apparatus of claim 1, wherein a thickness of the intermixing region is less than a thickness of the first portion.

6. The apparatus of claim 1, wherein the intermixing region is formed on the outside of the sealant.

7. An organic light-emitting display apparatus comprising:
   a first substrate;
   an organic light-emitting device provided on the first substrate and comprising a first electrode, a second electrode, and an intermediate layer positioned between the first electrode and the second electrode;
   a second substrate covering the organic light-emitting device and disposed to face the first substrate; and
   a first sealant and a second sealant bonding the first substrate and the second substrate and disposed to face each other, and comprising a first portion including organic material and a second portion including an inorganic material,
   wherein both of the first portion and the second portion are connected to the first substrate and the second substrate,
     wherein at least one selected from the first sealant and the second sealant comprises a intermixing region in which the organic material is partially permeated by the inorganic material, and
   wherein both a first proportion of the inorganic material in the first intermixing and a second proportion of the inorganic material in the second intermixing region decrease in a direction from the second portion to the first portion.

8. The apparatus of claim 7, wherein at least one selected from the first intermixing region and the second intermixing region is formed by using sequential vapor infiltration (SVI).

9. The apparatus of claim 7, wherein each of the first organic material and the second organic material includes one or more materials selected from the group consisting of an acrylate-based resin, a methacrylate-based resin, polyisoprene, a vinyl-based resin, an epoxy-based resin, a urethane-based resin, a cellulose-based resin, and a parylene-based resin.

10. The apparatus of claim 7, wherein each of the first inorganic material and the second inorganic material includes one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

11. The apparatus of claim 7, wherein the first intermixing region and the second intermixing region face the outside of the organic light-emitting display apparatus.

* * * * *